United States Patent [19]

Matsuzaki et al.

[11] Patent Number: 5,576,986
[45] Date of Patent: Nov. 19, 1996

[54] MEMORY DEVICE USING MICRO VACUUM TUBE

[75] Inventors: Kazuo Matsuzaki; Yoshiyuki Sakai; Yuichi Urano, all of Nagano; Hidekatsu Kuroda, Mie; Akira Amano, Nagano, all of Japan

[73] Assignee: Fuji Electric Co. Ltd., Kawasaki, Japan

[21] Appl. No.: 322,491

[22] Filed: Oct. 14, 1994

[30] Foreign Application Priority Data

Oct. 14, 1993 [JP] Japan .................. 5-256592

[51] Int. Cl.⁶ .................................. G11C 11/00
[52] U.S. Cl. ................... 365/129; 365/118; 315/349
[58] Field of Search .......................... 365/128, 118, 365/129; 315/244, 349, 169.4, 358, 8.51

[56] References Cited

U.S. PATENT DOCUMENTS

| | | | |
|---|---|---|---|
| 3,787,705 | 1/1974 | Bolin | 315/267 |
| 3,949,264 | 4/1976 | Hofstein | 315/16 |
| 4,185,226 | 1/1980 | Heymann | 315/396 |
| 4,196,373 | 4/1980 | Parks | 315/391 |
| 5,155,567 | 10/1992 | Haga | 257/431 |

FOREIGN PATENT DOCUMENTS 63-237293  10/1988  Japan .

OTHER PUBLICATIONS

"The Electrochemistry of Gases and Other Dielectrics" by G. Glockler and S. C. Lind; John Wiley & Sons, 1939, p. 106.

IEEE Transactions on Electron Devices, vol. 38, No. 10 (Oct. 1991), pp. 2334–2336.

*Primary Examiner*—A. Zarabian
*Attorney, Agent, or Firm*—Rossi & Associates

[57] ABSTRACT

A highly reliable memory device with excellent heat resistance that can be used in any environment utilizes a chemical change to define a state transition. The memory device includes a micro vacuum tube structure having a recess portion formed on an upper face of a quartz substrate, a cold cathode having many comb-tooth like tips extending from the quartz substrate over to one side of the recess portion, a rectangular control electrode disposed on the side of the cold cathode at the bottom of the recess portion, an anode extending from the quartz substrate over to the other side of the recess portion and facing opposed to the cold cathode, and a sealing member for vacuum sealing a space inside the recess portion $11a$. $N_2$ and $O_2$ gases are enclosed in a space under the pressure of 0.2 mmHg. By changing the control electrode voltage, energy of accelerated electrons is changed: NO is produced at the control voltage of 17 eV, NO2 at 23 eV and the product gases dissociate to $N_2$ and $O_2$ by glow discharge at the control voltage higher than 23 eV. The chemical reaction is used to indicate the storage of information.

8 Claims, 3 Drawing Sheets

MEMORY DEVICE USING MICRO VACUUM TUBE

FIELD OF THE INVENTION

The present invention relates to a non-volatile electric memory device, and more specifically, the present invention relates to a memory device which uses a micro vacuum tube.

BACKGROUND

According to the prior art, electric memory devices typically use semiconductor memories such as a DRAM, an SRAM, a mask ROM, a PROM including an EPROM, and an EEPROM which are based on MOS technology. In addition, a non-volatile memory such as an FRAM has been also developed recently. Semiconductor memories with more capacity and which operate at higher speed with less power consumption have been required. A processing technique which facilitates realizing a finer memory capacitor (memory cell) has also been investigated. Corresponding to these technical trends, the fine-processing technique has progressed year by year and is rapidly approaching its physical limit.

On the other hand, magnetic materials are used for the major large capacity recording media. Magnetic recording has a problem in obtaining a recording media suitable for higher recording densities and a problem that the magnetic recording relies on mechanical parts including a read-write head.

The semiconductor memories described above based on a MOS structure and a PN junction structure are not reliably used at high temperatures or in cosmic space because of their poor heat resistance and radiation resistance. Magnetic recording cannot retain highly reliable volatility at high temperatures or in the strong magnetic field environment because the magnetic recording is based on magnetization.

In the semiconductor memories and the magnetic memories, thermal and electromagnetic influence directly cause malfunctions, because the semiconductor memories and the magnetic memories relate electric state change and electromagnetic state change with a memory function (state transition). From the stand point of non-volatility, it is important to relate the memory function with a semi-permanent state change. In view of this, chemical change of material, which occurs by bonding and dissociation of the material, provides the most general example of the non-volatility.

In view of the foregoing, an object of the present invention is to provide a memory device with excellent heat resistance which can be used with a high degree of reliability in any environment by realizing a non-volatile memory which utilizes chemical change as state transition.

Though the non-volatile memory which utilizes chemical change as state transition provides highly reliable non-volatility, it is usually difficult to controllably enhance state transition (bonding and dissociation of material). To avoid this difficulty, the present inventors have perceived a gas mixture which can react forward and backward to be a data carrier, and a micro vacuum tube to be used as a data storage means.

SUMMARY OF THE INVENTION

The object of the present invention is achieved by a memory device which stores data by enhancing controllable chemical change by collision of accelerated electrons into a reversibly reactive gas mixture in the micro vacuum tube, and reads out the data by detecting a current value or an electromagnetic wave intensity after the chemical change. That is, the memory device of the present invention is comprised of a micro vacuum tube comprising a field effect electron emitter portion for controlling emission of electrons from a cold cathode with voltage of a control electrode, an anode for capturing the emitted electrons through vacuum space, and a reversibly reactive gas mixture enclosed in the micro vacuum tube, bonding energy of the gas mixture being different from dissociation energy of the gas mixture.

The memory device of the present invention is comprised preferably of an electromagnetic wave source for irradiating an electromagnetic wave to the micro vacuum tube, and an electromagnetic wave detecting means for detecting an electromagnetic wave which has transmitted through the micro vacuum tube and for converting the detected electromagnetic wave to an electric signal. The electromagnetic wave source is preferably a visible light source, an ultraviolet light source, or a microwave radiation source.

The micro vacuum tube of the present invention utilizes a cold cathode electron emission mechanism (quantum mechanical tunneling by the Schottky effect). Since surface potential width is narrowed by an electric field which affects to the boundary surface of the cold cathode when voltage is applied to the control electrode, electrons are emitted from the cold cathode. An anode current flows, since the emitted electrons are attracted by the electric potential of the anode (collector electrode) and arrives via the vacuum space at the collector electrode. The micro vacuum tube of the present invention can be used in any environment since the field effect electron emission portion is comprised of a cold cathode and since the electron path is under vacuum. This micro vacuum tube encloses in it a reversibly reactive gas mixture, the bonding energy and the dissociation energy of which are different. The gas mixture is comprised, for example, of a first gas (gas molecule or atom A) and a second gas (gas molecule or atom B). The accelerated electrons collide into the molecules or the atoms of the mixed gases in certain probability while the electrons are travelling. Chemical reaction between the first and the second gases does not occur, irrespective of whether the collision is elastic or inelastic when the voltage applied to the control electrode is low and electron energy (kinetic energy) is lower than the bonding energy of the gas mixture. In this case, the collision of the electrons into the gas molecules does not enhance the chemical reaction between the first and the second gases and the anode current value is low corresponding to slightly the degree of vacuum caused by the existence of the gas mixture. However, when the electrons are provided with higher energy than the bonding energy by setting the voltage applied to the control electrode at a write-in voltage value (data storage voltage value), the first and the second gases react with each other and produce a product material (gas product). That is, a chemical reaction as expressed by a following formula is enhanced.

$$e^* + A + B \rightarrow e + C \tag{1}$$

Here, e* represents an accelerated electron which has energy higher than the bonding energy of the gas mixture, e an electron with low energy after the collision, and C a molecule or an atom of the product gas. This chemical change corresponds to a state change, and data is stored by applying voltage to the control electrode so as to provide the electron with energy higher than the bonding energy.

The application of voltage to the control electrode does not trigger immediate chemical reaction of all the mixed gas molecules. The chemical reaction shows time dependence and the product gas molecules increase monotonously. However, since an increase curve of the product gas molecule shows saturation, it is useless to apply the storage voltage for relatively long time. The existence of the product material C in the gas mixture accompanies changes in the other parameters such as increase or decrease of degree of vacuum, collision cross section (collision probability density), etc. When the chemical change of the first and the second gases A and B lowers partial gas pressure, for example, the anode current show higher value than that before the reaction since degree of vacuum becomes higher as a result of the chemical change. That is, the anode current shows a low value in the state of no data storage (before reaction), and high value in the state of data storage (after reaction). Therefore, the stored data can be read out by setting voltage applied to the control electrode at a read-out voltage value lower, for example, than the data storage voltage value and by detecting the anode current at the set control electrode voltage.

When electrons which have dissociation energy higher than the bonding energy collide into the product gas molecules or the atoms C under the application of erasure voltage to the control electrode, a following reverse reaction occurs, since the first and the second gases A and B enclosed in the electron path constitute a reversibly reactive gas mixture.

$$e^{**}+C \rightarrow e+A+B \qquad (2)$$

Here, $e^{**}$ represents an accelerated electron which has energy higher than the dissociation energy and the energy of $e^{*}$. Therefore, initialization can be conducted by promoting the reaction of formula 2 by further biasing the potential of the control electrode by which to erase the stored data.

The data can be read out as a binary anode current value also by appearance and disappearance of an absorption spectrum associated with the chemical change of the gases as effectively as by increase and decrease of the degree of vacuum and the collision cross section. That is, in the memory device which is further comprised of an electromagnetic wave source for radiating an electromagnetic wave to the micro vacuum tube; and an electromagnetic wave detecting means for detecting an electromagnetic wave which has transmitted through the micro vacuum tube and for converting the detected electromagnetic wave to an electric signal, when the absorption spectrum of the product gas is included in the wavelength range of the radiated electromagnetic wave, transmission intensity of the electromagnetic wave lowers after the occurrence of the chemical change, since the electromagnetic wave is absorbed by the product gas. When the absorption spectrum of the product gas is not included in the wavelength range of the electromagnetic wave, and the absorption spectra of the first and the second gases are included in the wavelength range of the electromagnetic wave, transmission intensity of the electromagnetic wave becomes high after the occurrence of the chemical change, since the electromagnetic wave is less absorbed by the product gas. Thus, the electromagnetic wave detecting means for detecting an electromagnetic wave and for converting the detected electromagnetic wave to an electric signal facilitates reading out the stored data.

BRIEF DESCRIPTION OF THE DRAWINGS

The invention will be described in greater detail with reference to the following detailed description of the preferred embodiments and the accompanying drawings, wherein.

DETAILED DESCRIPTION OF THE PREFERRED EMBODIMENTS

Now the present invention will be described in detail hereinafter with reference to the accompanied drawings which illustrate preferred embodiments of the present invention.

Figure 1A:
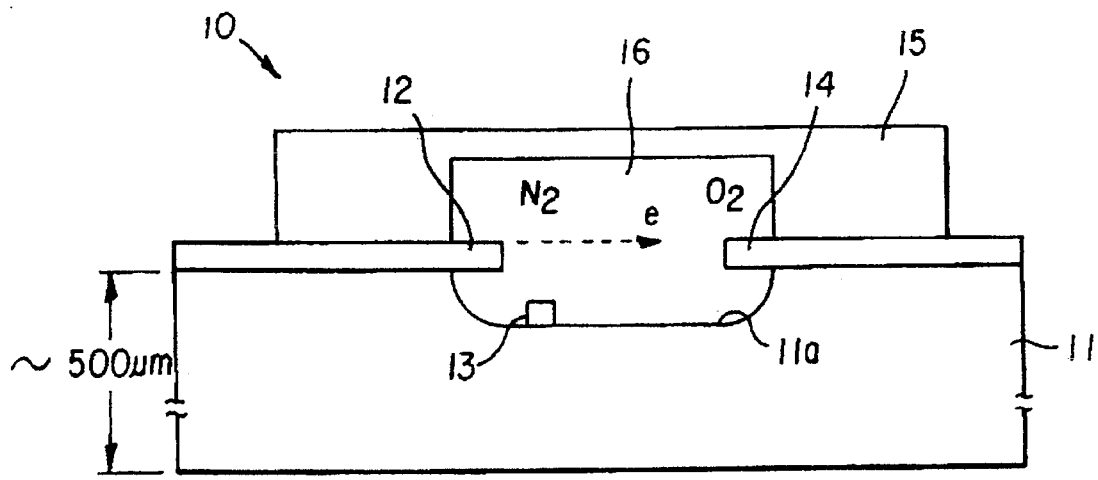
FIGS. 1 (a) and 1 (b) show an embodiment of the memory device according to the present invention, in which FIG. 1 (a) is a sectional view and FIG. 1 (b) is a top plan view.
Figure 1B:
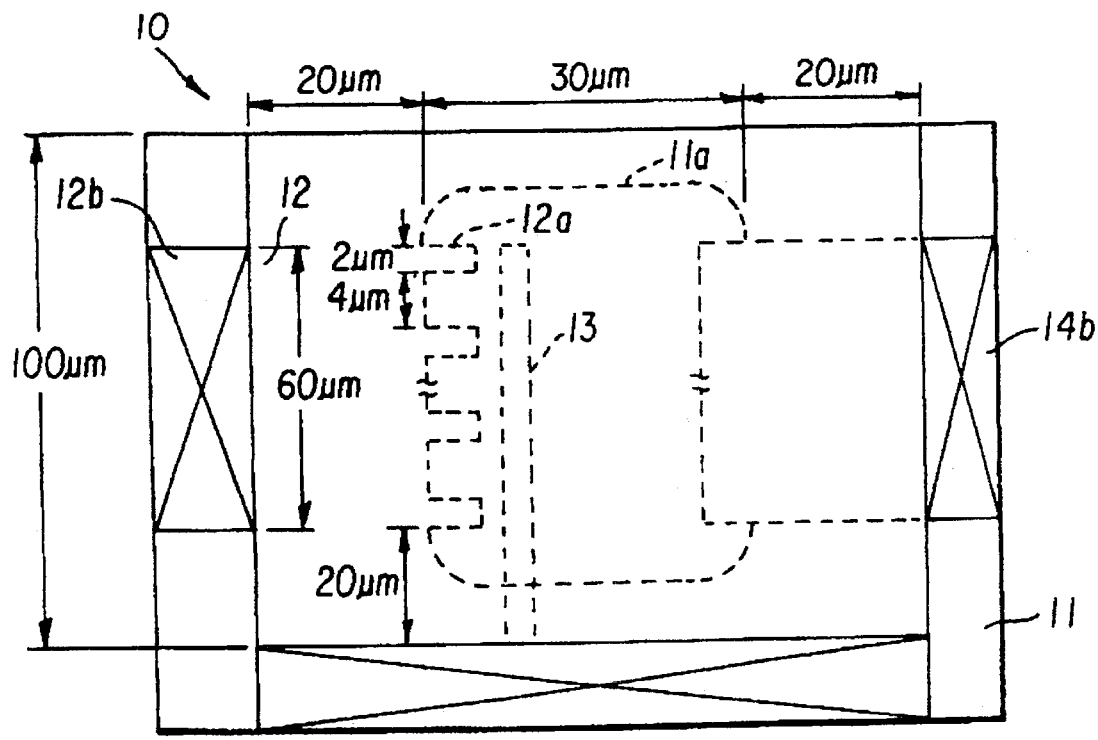

FIG. 1 (a) is a sectional view, and FIG. 1 (b) is a top plan view showing the first embodiment of the memory device according to the present invention. A memory device 10, which uses a micro vacuum tube structure, is comprised of a recess portion 11a formed on an upper face of a quartz substrate 11 with thickness of about 500 μm; a wolfram cold cathode (emitter electrode) 12 having many comb-tooth like tips 12a extending from the upper portion of the quartz substrate 11 over to one side of the recess portion 11a; a rectangular niobium control electrode 13 disposed on the side of the cold cathode 12 of the bottom of the recess portion 11a; a wolfram anode (collector electrode) 14 extending from the upper portion of the quartz substrate 11 over to the other side of the recess portion 11a and opposed facing to the cold cathode 12; and a sealing member 15 for vacuum sealing a space or chamber inside the recess portion 11a. The thickness of electrode pad portions 12b and 14b of the cathode 12 and the anode 14 is preferably 0.2 μm. The width of the comb-tooth like tips 12a of the cold cathode 12 is preferably 2 μm, and the tips are separated by a distance of 4 μm. The control electrode 13 is preferably 0.5 μm in thickness and 5 μm in width. The distance between the tip 12a of the cold cathode 12 and the control electrode 13 is about 1 μm. The size of the memory device 10 is 100 μm×70 μm. A nitrogen gas ($N_2$) and an oxygen gas ($O_2$) of both 0.2 mmHg are sealed in a vacuum space or chamber 16 of the memory device 10.

Energy of accelerated electrons emitted from the cold cathode 12 is changed by voltage applied to the control electrode 13. The accelerated electrons e triggers the following reaction by colliding into molecules of the mixed gases.

The first discharge reaction of the gas mixture of $N_2$ and $O_2$ produces nitrogen monoxide as follows.

$$e^{*}+N_2+O_2 \rightarrow e^{*}+N_2^{+}+O_2 \rightarrow 2NO \qquad (3)$$

This chemical change which produces nitrogen monoxide NO occurs when the energy of the accelerated electron $e^{*}$ is higher than the first bonding energy of 17 eV.

The second discharge reaction of the gas mixture of N2 and O2 produces nitrogen dioxide as follows.

$$e^{*}+N_2+O_2 \rightarrow e^{*}+N^{+}+O_2 \rightarrow NO_2 \qquad (4)$$

This chemical change which produces nitrogen dioxide $NO_2$ occurs when the energy of the accelerated electron $e^{*}$ is higher than the second bonding energy of 23 eV. Nitrogen monoxide NO and nitrogen dioxide $NO_2$ dissociate by glow discharge and return to ($N_2+O_2$) through the reverse reaction of formulas 3 and 4 when the accelerated electron e* has energy corresponding to the dissociation energy higher than the second bonding energy of 23 eV.

Figure 2:
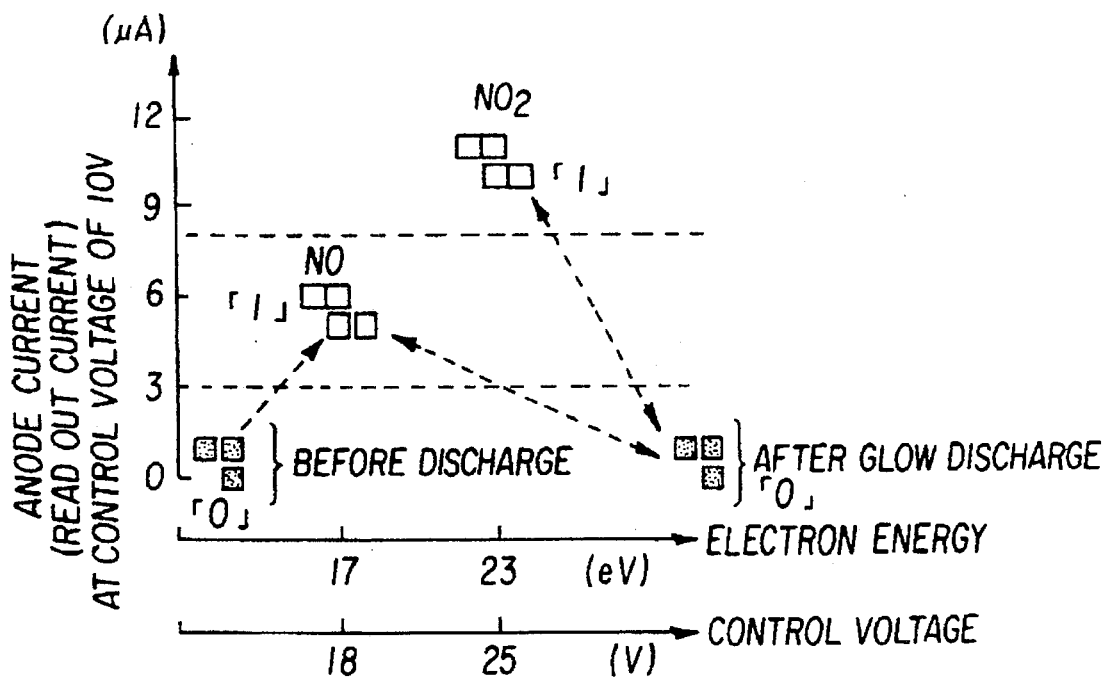
FIG. 2 is a graph for explaining data storage and read out in the embodiment of FIG. 1.

In this embodiment, the anode voltage is set at 200 V. When voltage of less than 18 V, for example 10 V, is applied to the control electrode 13, the measured anode current values are almost zero, i.e., less than 3 µA as shown in FIG. 2. The anode current shows an almost constant value when voltage of less than 18 V is applied to the control electrode 13 in the state before the discharge reaction of formula 3 or 4 occurs in which only $N_2$ and $O_2$ are contained in the gas mixture.

The reaction of formula 3 which produces nitrogen monoxide NO is promoted when voltage of 18 V is applied to the control electrode 13 so that the energy of the accelerated electrons may coincide with the first bonding energy of 17 eV. As known from formula 3, the anode current, measured by setting the applied control electrode voltage at the read out voltage of 10 V, increases to about 6 µA as FIG. 2 shows. Since the collision cross section lowers, though the pressure of gas mixture before NO production (0.4 mmHg) is equal to the pressure of the gas mixture which contains nitrogen monoxide NO. In the transient period, the anode current increases continuously from 3 µA to 6 µA as the number of nitrogen monoxide molecules NO increases. Therefore, one can assign the state before the discharge reaction to a logical value "0" and the state after the discharge reaction of formula 3 to a logical value "1". The stored data can be read out by applying the read out voltage of 10 V which lowers the energy of the electrons down below the first bonding energy of 17 eV. The transient monotonous increase of the anode current may be utilized for fuzzy data storage. Then, since glow discharge promotes the reverse reaction of formula 3 when the erasure voltage of about 50 V is applied to the control electrode 13 after the discharge reaction of formula 3, the nitrogen monoxide molecules dissociate to decrease and the molecules of $N_2$ and $O_2$ increase. As FIG. 2 shows, the anode current is less than 3 µA at the read out control electrode voltage of 10 v. Therefore, the state after the glow discharge can be assigned to the logical value "0".

Next, the reaction of formula 4 is promoted and nitrogen dioxide NO2 is produced in the gas mixture, since the energy of the accelerated electrons coincides with the second bonding energy of 23 eV when a voltage of 25 V is applied to the control electrode. Since this chemical change raises the degree of vacuum, the anode current increases to 10 µA when the read out voltage is 10 V. Therefore, the state after the reaction 4 can be assigned to the logical value "1". Then, the nitrogen monoxide molecules dissociate to decrease and the molecules of $N_2$ and $O_2$ increase by setting the control voltage at 50 V, since glow discharge occurs which promotes the reverse reaction of formula 4. As FIG. 2 shows, the anode current returns to less than 3 µA at the read out control electrode voltage of 10 v. Therefore, the state after the glow discharge can be assigned to the logical value "0".

Figure 3:
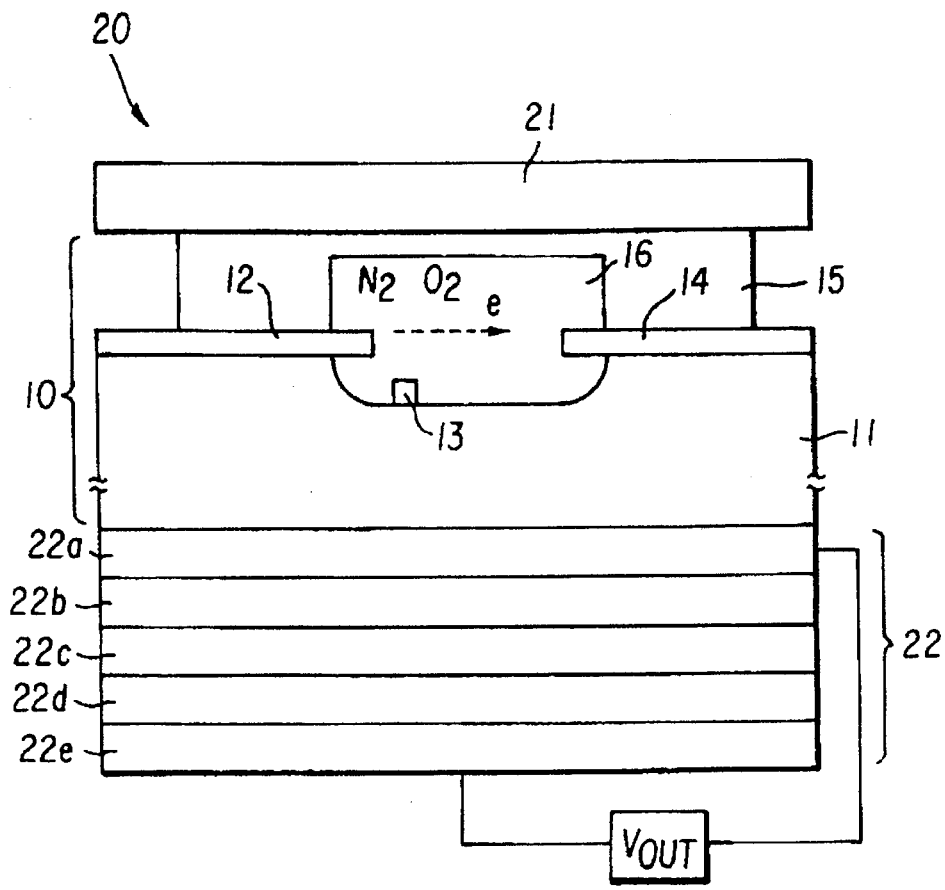
FIG. 3 is a sectional view of the second embodiment of the memory device according to the present invention.

Thus, data can be stored and erased by changing over the control voltage value (storage voltage: 18 V or 25 V, erasure voltage: 50 V). The stored data can be read out by measuring anode current value by setting the control voltage at the read out voltage of 10 V. A highly reliable non-volatile memory is realized, since data storage depends on existence and non-existence of the pertinent materials. The present invention provides a memory device with excellent controllability, since storage, read out and erasure of data are conducted by application of the control voltage and by detection of the anode current. The memory device according to the present invention can be used in any environment because of its excellent heat resistance and radiation resistance, since the electron collision system for enhancing the chemical changes is comprised of a micro vacuum tube. FIG. 3 is a sectional view showing a second embodiment of the memory device according to the present invention. A memory device 20 shown in FIG. 3 is comprised of the memory device 10 of FIG. 1; a SiC blue light emitting diode 21 formed on a transparent sealing member 15; and a solar cell type photoelectric converter element 22 formed on the back surface of the quartz substrate. The central wave number λ of the emitted light from the light emitting diode 21 is 450 nm. The photoelectric converter element 22 is further comprised of a transparent electrode (ITO : $SnO_2$) 22a; an n-type amorphous silicon layer 22b; an intrinsic amorphous silicon layer 22c; a p-type amorphous silicon layer 22d; and an aluminum electrode 22e, which are laminated one by one on the back surface of the quartz substrate 11.

Figure 4:
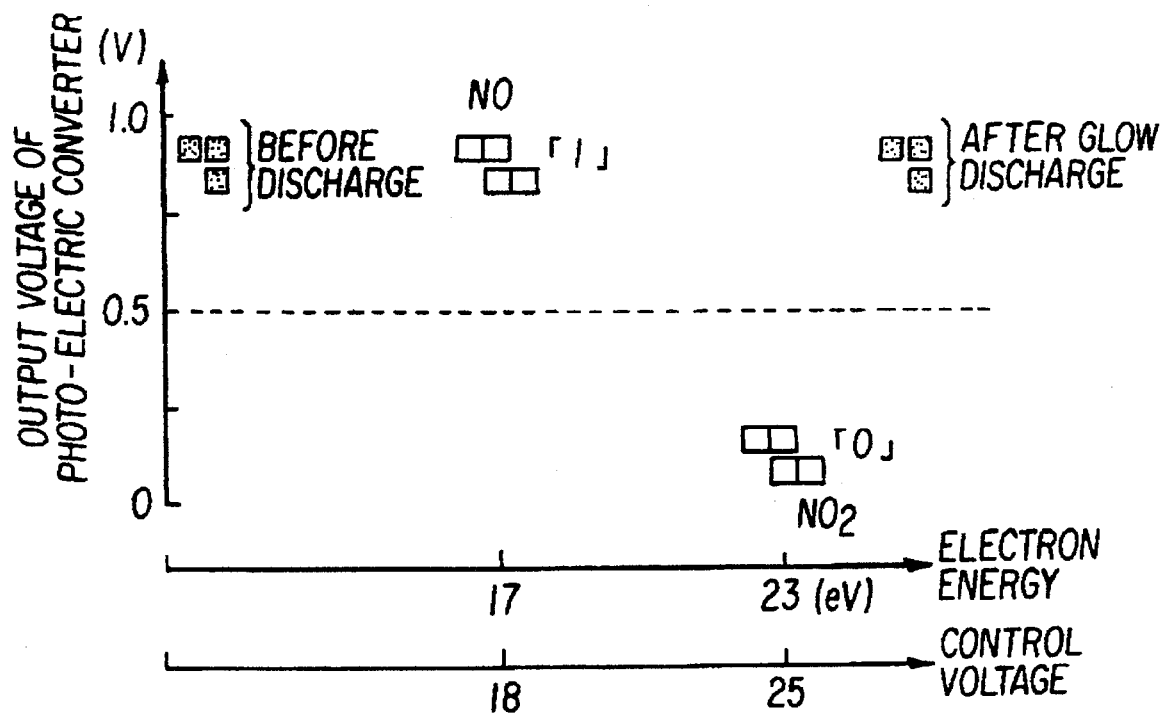
FIG. 4 is a graph for explaining data storage and read out in the embodiment of FIG. 3.

The memory device 20 of the second embodiment stores data by changing the applied voltage of the control electrode 13 similarly as the memory device 10 of the first embodiment. However, the memory device 20 reads out stored data by detecting output voltage value $V_{OUT}$ of the photoelectric converter element 22: the memory device 20 does not detect the anode current value. In the read out mode, the light emitting diode 21 radiates blue light to a vacuum space 16 and the photoelectric converter element 22 receives transmitted blue light. The gas mixture which contains only $N_2$ and $O_2$ does not absorb light in the wavelength range of the irradiated light (λ=450 nm), since the absorption spectrum of nitrogen exists below 134 nm the absorption spectrum of oxygen exists below 141 nm. Nitrogen monoxide, a reaction product of formula 3, does not absorb the blue light from the light emitting diode 21, since the absorption spectrum of nitrogen monoxide exists below 230 nm. However, nitrogen dioxide well absorbs the blue light from the light emitting diode 21 and decreases transmitted light quantity, i.e. quantity of light received by the photoelectric converter element 22, since the absorption spectrum of nitrogen dioxide exists in the range between 300 and 500 nm. As shown in FIG. 4, the output voltage value $V_{OUT}$ of the photoelectric converter element 22 is less than 0.5 V when nitrogen dioxide exists and about 1 v when nitrogen monoxide exists. Therefore, the state in which nitrogen monoxide exists can be assigned to a logical value "1" and the state in which nitrogen dioxide exists can be assigned to a logical value "0". The intermediate output voltage $V_{OUT}$ may be used for fuzzy data storage, since $V_{OUT}$ decreases monotonously as nitrogen dioxide increases. In binary logic, the intermediate output voltage, e.g. 0.5 V, may be used as a threshold value.

In the embodiments described above, stored data is read out by detecting the anode current value or the output value of the photoelectric converter element. The stored data may be read out, for example, by an electromagnetic detection means. Mixed gases enclosed in the micro vacuum tube are not limited to nitrogen gas and oxygen gas and any gas mixture may be used, the bonding energy of which is different from its dissociation energy. In this case, electromagnetic radiation source is not limited to the visible light source described above and radiation sources which radiate ultraviolet light or a microwave may be used. Furthermore, a data read out means which simultaneously detects the anode current as in the first embodiment and the output voltage of the photoelectric converter as in the second embodiment may also be used.

The memory device according to the present invention, which is comprised of a micro vacuum tube in which a reversibly reactive gas mixture is enclosed, provides following effects.

(1) A semipermanently non-volatile memory with more reliability of data storage is realized, since data is stored on the bias of change in the pertinent materials (bonding and dissociation of gas molecules).

(2) The memory device of the present invention can be used in any environment because of its excellent heat and radiation resistance, since the field effect electron emission portion is comprised of a cold cathode and the electron path is under vacuum.

(3) The memory device of the present invention facilitates electronic control and provides with excellent controllability, since data can be stored or read out at will by changing the control voltage of the micro vacuum tube.

The invention has been described with reference to certain preferred embodiments thereof. It will be understood, however, that modifications and variations are possible within the scope of the appended claims.

What is claimed is:

1. A micro memory device comprising:
   a micro storage chamber;
   a field effect electron emitter portion for controlling emission of electrons from a cold cathode located in said micro storage chamber with a voltage applied to a control electrode;
   an anode located in said micro storage chamber for capturing electrons emitted from said cold cathode through a space of said micro storage chamber; and
   a reversibly reactive gas mixture enclosed in said micro storage chamber, wherein a bonding energy of said gas mixture is different from a dissociation energy of said gas mixture.

2. The memory device as claimed in claim 1 further comprising:
   an electromagnetic wave source for irradiating an electromagnetic wave to said micro chamber; and
   an electromagnetic wave detecting means for detecting electromagnetic wave which has transmitted through said micro vacuum chamber and for converting said detected electromagnetic wave to an electric signal.

3. The memory device as claimed in claim 2, wherein said electromagnetic wave source comprises a visible light source.

4. The memory device as claimed in claim 2, wherein said electromagnetic wave source comprises an ultraviolet light source.

5. The memory device as claimed in claim 2, wherein said electromagnetic wave source comprises a microwave radiation source.

6. The memory device as claimed in claim 1, wherein said micro chamber comprises a quartz substrate including a recess portion formed on an upper face of said quartz substrate and a sealing member located over the recess portion.

7. A micro memory device comprising:
   a micro storage chamber;
   a field effect electron emitter portion for controlling emission of electrons from a cold cathode located in said micro storage chamber with a voltage applied to a control electrode;
   an anode located in said micro storage chamber for capturing electrons emitted from said cold cathode through a space of said micro storage chamber;
   a reversibly reactive gas mixture enclosed in said micro storage chamber, wherein a bonding energy of said gas mixture is different from a dissociation energy of said gas mixture;
   wherein said micro storage chamber comprises a quartz substrate including a recess portion formed on an upper face of said quartz substrate and a sealing member located over the recess portion; and
   wherein said cold cathode is located on the upper face of the quartz substrate and includes comb-like tips extending over a first side of the recess portion, said control electrode is disposed on a bottom surface of the recess portion, and said anode is located on the upper face of the quartz substrate and extends over a second side of the recess portion that is opposite said first side.

8. The memory device as claimed in claim 1, wherein said reactive gas mixture includes nitrogen gas and oxygen.

* * * * *